United States Patent [19]

Yamaguchi et al.

[11] Patent Number: 4,858,190

[45] Date of Patent: Aug. 15, 1989

[54] DUAL PORT SEMICONDUCTOR MEMORY HAVING RANDOM AND SERIAL ACCESS MODES

[75] Inventors: Yasunori Yamaguchi, Tachikawa; Akirahiko Yoshida, Kawasaki; Masami Nei, Musashino; Masamichi Ishihara, Hinode; Yukio Yamamoto, Musashino, all of Japan

[73] Assignees: Hitachi, Ltd.; Hitachi VLSI Engineering Corp., Tokyo, Japan

[21] Appl. No.: 5,104

[22] Filed: Jan. 20, 1987

[30] Foreign Application Priority Data

Mar. 7, 1986 [JP]  Japan ................................ 61-48403

[51] Int. Cl.[4] .......................... G11C 7/00; G11C 8/00
[52] U.S. Cl. ............................... 365/189.05; 365/221; 365/230.07; 365/230.05; 340/800
[58] Field of Search ............... 365/221, 219, 230, 233, 365/239, 240, 78, 189; 340/750, 798, 799, 800

[56] References Cited

U.S. PATENT DOCUMENTS

| 4,402,067 | 8/1983 | Moss et al. ......................... 365/189 |
| 4,412,313 | 10/1983 | Aekland et al. ..................... 365/240 |
| 4,422,160 | 12/1983 | Watanabe ............................ 365/189 |
| 4,498,155 | 2/1985 | Mohan Rao ......................... 365/189 |
| 4,646,270 | 2/1987 | Voss .................................... 365/221 |
| 4,723,226 | 2/1988 | McDonough et al. .............. 365/230 |

OTHER PUBLICATIONS

Nikkei Electronics, Aug. 12, 1985, pp. 211–240.

Primary Examiner—Stuart N. Hecker
Assistant Examiner—Glenn A. Gossage
Attorney, Agent, or Firm—Antonelli, Terry & Wands

[57] ABSTRACT

A semiconductor memory is provided in which a column decoder is used commonly for the random input and output and the serial input/output by providing both a signal path for transmitting signals in parallel to the data lines of a memory array and a latch circuit and a switch path for connecting said latch circuit and a serial input/output common data line in response to a selection signal generated by a shift register, and by feeding the output signal of a random input/output column decoder as an initial value to the individual bits of said shift register.

29 Claims, 3 Drawing Sheets

DUAL PORT SEMICONDUCTOR MEMORY HAVING RANDOM AND SERIAL ACCESS MODES

BACKGROUND OF THE INVENTION

The present invention relates to a semiconductor memory and, more particularly, to a technique which is effective when utilized in a dual-port memory having a serial input/output function and a random input/output function for image processing, for example.

As a memory for image processing effective for displaying letters and drawings on the frame of a CRT (i.e., Cathode Ray Tube), there are known in the art, for example, memories which are disclosed on pp. 219 to 229, "NIKKEI ELECTRONICS" published by NIKKEI McGRAW-HILL, on Feb. 11, 1985 and pp. 211 to 240, "NIKKEI ELECTRONICS" published on Aug. 12, 1985.

The former memory transfers the signals of a memory array in parallel to a shift register and outputs them in series, or inputs the signals in series to the shift register and writes them in parallel in the memory array.

On the other hand, the latter memory requires decoder circuits especially for random access and serial output function of a memory array, respectively. Moreover, the serial output function operates such a dynamic latch circuit as an amplifier as will fetch the signals of data of the memory array in parallel and output them in series.

SUMMARY OF THE INVENTION

Our investigations of the application of an image processing memory have concluded that a relatively high-grade image processing memory is desired to have the following functions: a random input/output function; a serial input/output function; and a function to designate the head address of serial input/output. These functions are desired to be simultaneously realized by a simple circuitry.

An object of the present invention is to provide a semiconductor memory which has both a random input/output function and a serial input/output function.

Another object of the present invention is to realize the above-specified two functions by a simple circuit construction.

Still another object of the present invention is to provide a semiconductor memory which has a function to designate the head address of a serial input/output in addition to the above two functions.

A further object of the present invention is to provide a semiconductor memory which can execute the random input/output while it is executing the serial input/output.

A further object of the present invention is to provide a semiconductor memory which is intended to simplify the circuitry and to improve the functions.

The aforementioned and other objects and the novel features of the present invention will become apparent from the following description taken with reference to the accompanying drawings.

A representative of the invention to be disclosed hereinafter will be briefly summarized in the following.

By providing both a signal path for transmitting signals in parallel to the data lines of a memory array and a latch circuit, and a switch path for connecting the latch circuit and a serial input/output common data line in response to a selection signal generated by a shift register, and by feeding the output signal of a random input/output column decoder as a start(head) value to the individual bits of said shift register, a column decoder is used commonly for the random input and output and the serial input/output.

According to the above-specified means, the serial input/output and the random input/output can be effected, and the circuitry can be simplified by generating a selection signal for the random input/output and head address for the serial input/output by the common column decoder.

DESCRIPTION OF THE PREFERRED EMBODIMENTS

Figure 1:
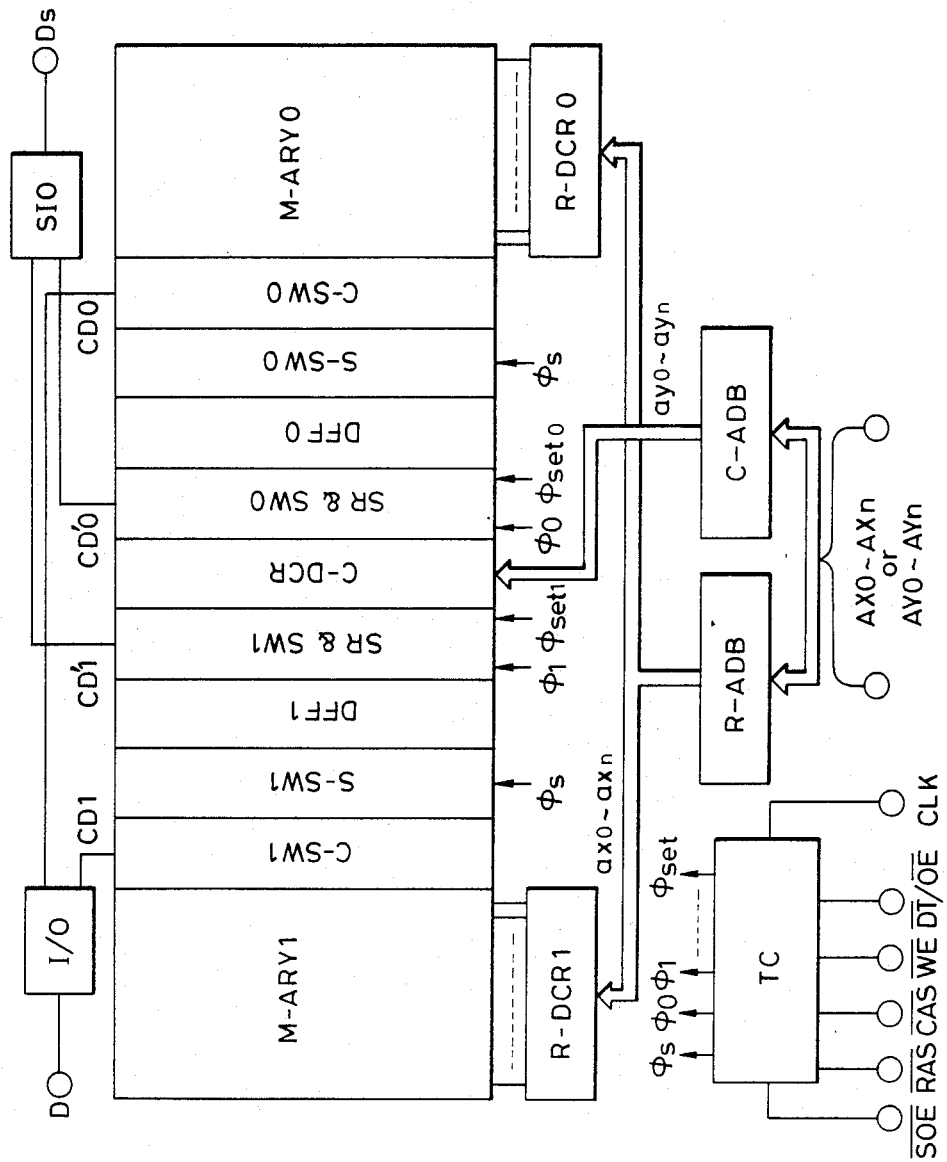
FIG. 1 is a block diagram showing a dynamic memory according to one embodiment of the present invention.

FIG. 1 is a block diagram showing one embodiment of the present invention. The individual circuit blocks of FIG. 1 are formed on a single semiconductor substrate of single-crystal silicon or the like, although not necessarily limited thereto by a well-known technique of fabricating a semiconductor integrated circuit. The major circuit blocks of FIG. 1 are drawn to coincide and be consistent with the actual geometrical arrangement on one chip.

To the semiconductor memory of this embodiment, although not specifically limited thereto, individual circuits for realizing the serial input/output function for image processing actions, as will be described hereinafter, are added by using as a basic component the memory array of a dynamic RAM to be accessed at a unit of 1 bit (i.e., x 1 bit structure).

In the case where signals of 4 bits of red, blue, green and brightness are to be stored, for example, for color image processings, memory arrays M-ARY, a random input/output circuit I/O and a serial input/output circuit SIO of FIG. 1 are formed with respect to constructing four groups so as to correspond to the aforementioned respective signals.

In this embodiment, although not specifically limited thereto, a pair of memory arrays M-ARY0 and M-ARY1 are arranged symmetrically with respect to a column decoder C-DCR. Between this column decoder C-DCR and the paired memory arrays M-ARY0 and M-ARY1, respectively, there are arranged random input/output selectors C-SW0 and C-SW1, serial input/output selectors SR&SW0 and SR&SW1, parallel transfer switch circuits S-SW0 and S-SW1 and latch circuits DFF0 and DFF1, as will be described hereinafter.

The memory arrays M-ARY0 and M-ARY1 include matrix-arranged one-MOSFET type dynamic memory cells and are constructed into the folded bit line type, in which paired data lines (i.e., complementary data lines) are arranged in parallel. The complementary data lines are extended transversely of FIG. 1. Each complementary data line is equipped with a precharge circuit, a sense amplifier and an active restore circuit, although not shown. It should be understood that these individual circuits can be included in each of the memory arrays M-ARY0 and M-ARY1 of FIG. 1. A word line is so extended longitudinally of FIG. 1 as to be connected with a row address decoder R-DCR1 or R-DCR2 at its one end and to intersect each complementary data line. This memory array construction is omitted in detail because it is similar to that of a known dynamic RAM.

The complementary data lines of the aforementioned memory arrays M-ARY0 and M-ARY1 are connected at their one-side ends through the column switch circuits C-SW0 and C-SW1 with random input/output common data lines CD0 and CD1, respectively. The column switch circuits C-SW0 and C-SW1 connect the complementary data lines selectively with the common data line CD0 or CD1 in accordance with the signal which is generated on the basis of a decode signal of the column address signal fed from the column decoder C-DCR when in a random access mode.

The aforementioned complementary data lines are coupled at their other ends through parallel transfer switch circuits S-SW0 and S-SW1 with the input/output terminals of data holding latch circuits DFF0 and DFF1. These latch circuits DFF0 and DFF1 have their input/output terminals connected with serial input/output common data lines CD'0 and CD'1, respectively, through the respective switch circuits SW of the serial input/output selectors SR&SW0 and SR&SW1 each of which is composed of the switch circuit SW and a shift register SR.

In a data transfer mode, data are transferred (or inputted and outputted) in parallel between the memory array M-ARY0 or M-ARY1 and the latch circuit DFF through the switch circuit S-SW0 or S-SW1 which is turned on in response to a signal $\phi s(\phi_{S1}$ or $\phi_{S2})$. On the other hand, data are transferred (or inputted and outputted) in series between the latch circuit DFF and the common data lines CD'0 and CD'1. The serial data input/output are transferred and as a result the switch circuit SW connects the 1 bit (i.e., the unit circuit) of the latch circuit DFF sequentially with the common data lines CD'0 and CD'1 in accordance with the output signal of the shift register SR.

In this embodiment, in order to enable the serial input/output to start from an arbitrary bit, the final-stage output signal of the shift register SR is fed back to the side of an initial-stage circuit. This causes the shift register SR to conduct a ring-shaped shifting action. The shift register SR has its initial value set (or the signal at a logic level "1" is located) by the decode signal of a column address signal fed from the column decoder C-DCR when in a later-described serial transfer mode. In other words, in the shift register SR, the selection signal of the logic "1" is set at a bit corresponding to the complementary data line of the memory array indicated by the column address signal. The shift register SR conducts the shift operation of the selection signal (at the logic "1" in response to shift clock signals $\phi 0$ and $\phi 1$ generated by the timing control circuit TC on the basis of the clock signal fed from an external terminal CLK. In this case, the shift clock signals $\phi 0$ and $\phi 1$ are made to have a period two times as long as that of the clock signal fed from the external terminal CLK and to have a half-period phase difference. As a result, the signals of the left and right memory arrays M-ARY0 and M-ARY1 are outputted alternately in series. Thus, the shift action of the shift register SR can be effected with one half of the frequency of the clock signal CLK. This means that the serial signal can be inputted and outputted with a frequency two times as high as that of the upper limit action frequency, as viewed from the side of the shift register SR.

The aforementioned common data lines CD0 and CD1 are coupled to a random input/output terminal D through the random input/output circuit I/O which is constructed of an output circuit composed of a main amplifier and a data output buffer and an input circuit composed of a data input buffer. The aforementioned common data lines CD'0 and CD'1 are coupled to a serial input/output terminal DS through the serial input/output circuit SIO which is constructed of an output circuit composed of a main amplifier and a data output buffer and an input circuit composed of a data input buffer. Each of the aforementioned serial input/output circuits is constructed of a static circuit.

A row address buffer R-ADB latches external address signals AX0 to AXn in synchronism with a not-shown timing signal generated by a row-address strobe signal $\overline{RAS}$ to generate internal complementary address signals ax0 to axn to be transmitted to the row address decoders R-DCR0 and R-DCR1. The row address decoders R-DCR0 and R-DCR1 decode the address signals ax0 to axn and select a predetermined word line (and dummy word line) in synchronism with a not-shown word line selection timing signal.

In synchronism with a not-shown timing signal generated by a column address strobe signal $\overline{CAS}$ fed later than the signal $\overline{RAS}$, a column address buffer C-ADB latches external address signals AY0 to AYn to transmit internal complementary address signals ay0 to ayn generated on the basis of the latches to the column address decoder C-DCR. This column address decoder C-DCR decodes the address signals ay0 to ayn and selects the data lines in synchronism with a not-shown data line selection (or column switch selection) timing signal. In a later-described parallel transfer mode of the data of the memory array, the decode output corresponding to the aforementioned data line selection signal of the column address decoder C-DCR is used to produce the initial value (i.e., the logic "1") of the aforementioned shift register SR.

The timing control circuit TC discriminates the action mode and generates a plurality of corresponding timing signals in response to the address strobe signals $\overline{RAS}$ and $\overline{CAS}$, a write enable signal $\overline{WE}$, a data transfer and output enable signal $\overline{DT/OE}$, and the clock signal CLK used for the serial input/output actions, which are fed from the external terminals.

As has been described hereinbefore, the memory arrays M-ARY0 and M-ARY1 and the individual circuit blocks arranged between the former, as shown in FIG. 1, are actually arranged in such a geometric form on one chip. More specifically, in order to use the output of the column decoder C-DCR commonly for the column switch C-SW and the shift register SR, circuits for the random input/output and serial input/output are interposed between the memory array M-ARY and the column decoder C-DCR. The column switch C-SW is provided as the random input/output circuit, and the parallel transfer switch circuit S-SW, the latch circuit DFF, and the shift register and switch circuit SR&SW are provided as the serial input/output circuit. The order of arrangement of these individual circuit blocks can be altered. Moreover, the column decoder is provided commonly for and at the center of the two (or more) memory arrays or the random and serial input/output circuits. This makes it possible to effect the random input/output and the serial input/output, to enhance their functions, and to improve the integration.

Figure 2:
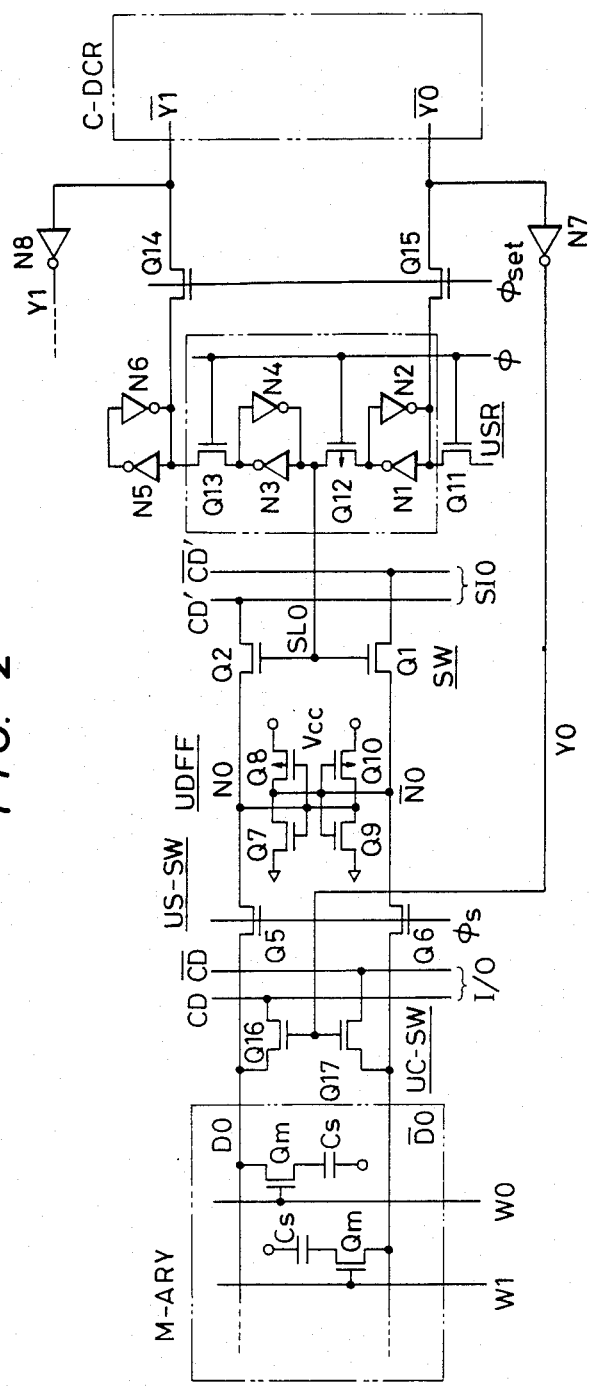
FIG. 2 is a circuit diagram showing one specific embodiment of the individual essential features of the random input/output and serial input/output of the memory of FIG. 1.

FIG. 2 is a circuit diagram showing one specific embodiment of each of the aforementioned random input/output and serial input/output circuits. In FIG. 2, P-channel MOSFETs are discriminated from N-channel MOSFETs by adding arrows to their channel portions.

In the block diagram of FIG. 1, moreover, each circuit block has a numeral added thereto for discrimination because it is paired. However, the numerals for discriminating the paired circuits are omitted from the embodiment circuit of FIG. 2 by constructing the paired circuits of an identical circuit although they are differently arranged.

The aforementioned memory array M-ARY includes a dynamic cell having a matrix arrangement and composed of an address selecting MOSFET (i.e., Insulated Gate type Field Effect Transistor) Qm and an information storing capacitor Cs. The address selecting MOSFET Qm of the aforementioned memory cell has its gate coupled to a corresponding word line W and its drain coupled to a data line D. The word line W and the data line D are constructed of the well-known folded bit line (or digit line) type, and the drain of the address selecting MOSFET Qm of the memory cell is coupled to corresponding complementary one D or $\overline{D}$ of a pair of data lines arranged in parallel, i.e., complementary data lines D and $\overline{D}$.

The complementary data lines D0 and $\overline{D0}$ shown as representatives are connected with random input/output common complementary data lines CD and $\overline{CD}$ through switch MOSFETs Q16 and Q17 constructing a random input/output unit column switch circuit UC-SW. These switch MOSFETs Q16 and Q17 have their gates fed with a signal Y0 which is inverted from the selection output signal $\overline{Y0}$ of the column decoder C-DCR by a CMOS inverter N7.

The complementary data lines D0 and $\overline{D0}$ in the aforementioned memory array M-ARY are coupled, on the other hand, to the input/output nodes N0 and $\overline{N0}$ of a unit data latch circuit UDFF through the MOSFETS Q5 and Q6 composing a unit parallel transfer switch circuit US-SW. The MOSFETs Q5 and Q6 have their gates fed together with other similar MOSFETs with the transfer timing signal $\emptyset$s, by which they are switched.

The unit latch circuit UDFF is constructed, although not necessarily limited thereto, by crossly connecting the inputs and outputs of two CMOS inverters composed of the N-channel MOSFETs Q7 and Q9 and the P-channel MOSFETs Q8 and Q10.

The paired input/output nodes N0 and $\overline{N0}$ of the unit latch circuit UDFF are connected, on the other hand, with serial input/output common data lines CD' and $\overline{CD'}$ through the switch MOSFETs Q1 and Q2 composing the serial input/output unit switch circuit SW. The common gate of those switch MOSFETs Q1 and Q2 is fed with the output signal SL0 of a unit circuit USR (i.e., the unit circuit corresponding to the complementary data lines D0 and $\overline{D0}$) of the shift register SR as the selection signal.

The unit shift registers USR has its front-stage half bit circuit composed of two CMOS inverters N1 and N2 like the aforementioned unit latch circuit UDFF, and the P-channel transmission gate MOSFET Q12 for transmitting their output signals to a rear-stage half bit circuit. Incidentally, in the unit circuit USR, the feedback inverter N2 is designed so that the conductance of the MOSFET composing it is reduced. As a result, the input signal of the inverter N1 is set at the level according to the signal transferred from the front stage through the N-channel transmission gate MOSFET Q11. In other words, the output signal of the inverter N1 is inverted by the signal fed through the MOSFET Q11. The rear-stage half bit circuit receiving the signal transferred by the aforementioned P-channel type transmission gate MOSFET Q12 is also composed of CMOS inverters N3 and N4 similar to the above ones and the N-channel type transmission gate MOSFET Q13. The aforementioned signal transmission MOSFETs Q11 to Q13 have their gates fed commonly with the aforementioned shift clock signal $\emptyset$. The signal at the input terminal of the aforementioned rear-half bit circuit is transmitted as the selection signal SL0 to the gates of the aforementioned switch MOSFETs Q1 and Q2. Incidentally, inverters N5 and N6 construct a unit circuit of a next-stage shift register. The final-stage output of the shift register does not pass through the transmission gate MOSFET corresponding to the transmission gate MOSFET Q13, but the output of the inverter constructing the latch circuit is fed back to the MOSFET Q11. The final-stage output is amplified and fed back by a drive circuit (not shown), taking the wiring length for this feedback into consideration.

For initial value setting, the aforementioned unit circuit USR is fed with the output signal $\overline{Y0}$ of the column decoder C-DCR through the switch MOSFET Q15. In other words, the signal $\overline{Y0}$ has a phase opposite the phase to signal Y0 which is fed to the random input/output switch circuit UC-SW corresponding to the unit circuit USR. The switch MOSFET Q15 is switched together with another similar switch MOSFET Q14 by a preset timing signal $\emptyset$ set. If the output signal $\overline{Y0}$ generated by the column decoder C-DCR, for example, is a low-level (i.e., the logic "0") selection signal, this low-level signal is latched in the front-stage circuit of the unit circuit USR in synchronism with the present timing signal $\emptyset$set. Another unit circuit is fed through the switch MOSFET Q14 or the like with a high-level (i.e., the logic "1") non-selection signal such as an output signal $\overline{Y1}$ generated by the column decoder C-DCR. The signal Y1 which is inverted from the signal $\overline{Y1}$ is fed to the gates of MOSFETs (not shown) which comprise the unit circuit US-SW corresponding to the MOSFET Q14. Incidentally, in the case where the column decoder C-DCR consists of a NAND gate circuit using the high-level (i.e., the logic "1") selection signal, its output signal is fed to the gates of the MOSFETs Q16 and Q17 of the column switch such as illustrated. On the other hand, a signal inverted from the output signal of the column decoder C-DCR in accordance with the data selection timing signal is fed as an initial value to the shift register SR. In the case, where one of the switch circuits US-SW and SW comprises an N-channel MOSFET only and the other a P-channel MOSFET, the signal having the same phase outputted from the column decoder C-DCR can be used as the selection signal.

The operations of this unit shift register USR is as follows. When the clock signal $\emptyset$ is at the high level, the N-channel type transmission gate MOSFETs Q11 and Q13 are turned on to effect the half-bit shift action. For example, the low-level selection signal is transferred from the front-stage circuit through the MOSFET Q11 to the input terminal of the inverter circuit N1. Simultaneously with this, the output signal (i.e., the high-level non-selection signal) of the inverter N3 is transferred through the MOSFET Q13 to the next-stage circuit.

Subsequently, when the clock signal ∅ varies to the low level, the N-channel MOSFETs Q11 and Q13 are turned off whereas the P-channel MOSFET Q12 is turned on so that the output signal (at the high level) of the inverter N1 is transmitted to the input side of the next half-bit circuit. As a result, the switch MOSFETs Q1 and Q2 are turned on so that the signal latched in the unit latch circuit UDFF is transferred to the common data lines CD' and $\overline{CD}$' and outputted to the external terminals DS through the not-shown main amplifier and output circuit.

Next, when the clock signal ∅ restores the high level, the high-level non-selection signal is transferred to the input of the inverter N1 from the front-stage circuit. Simultaneously with this, the low-level selection signal is transferred from the output of the inverter N3 to the next-stage circuit. When the clock signal ∅ is changed to the low level, moreover, this low level is transmitted to the input of the inverter N3. As a result, the switch MOSFETs Q1 and Q2 are turned off whereas the unit switch MOSFET of the switch circuit SW corresponding to the next-stage circuit is turned on so that the latch signal of the unit latch circuit UDFF corresponding to the next-stage circuit is transferred to the common data lines CD' and $\overline{CD}$'. The serial output actions are conducted by subsequently repeating similar actions.

On the other hand, the serial input actions can be conducted by controlling the operation of the shift register SR similar to the aforementioned ones. Input data synchronized with the clock signal ∅ are continuously fed to the common data lines CD' and $\overline{CD}$' through the serial input/output circuit from the serial input/output terminal DS. In synchronism with the clock signal ∅, the common data lines CD' and $\overline{CD}$' are sequentially connected with the unit latch circuit UDFF selected by the output of the shift register SR to latch the input data. Incidentally, in the case where an initial value such as the aforementioned one is set, the high-level selection signal SLO is generated in synchronism with the low level of the clock signal ∅.

One example of the operation of the semiconductor memory of the present embodiment will be briefly described with reference to the timing charts shown in FIGS. 3 and 4.

The semiconductor memory of this embodiment is enabled for both random input/output and serial input/output operation, and wherein serial input/output and the random input/output operations are effected in parallel. If the data transfer and output enable signal $\overline{DT/OE}$ is at the high level at the time of the edge of the row address strobe signal $\overline{RAS}$ or substantially at the time of the chip selection signal changing from the high level to the low level, this is in the random input/output mode. At this time, the random output or input is conducted in response to the high or low level of the write enable signal $\overline{WE}$ for the low-level period of the signal $\overline{RAS}$. If, on the other hand, the signal $\overline{DT/OE}$ is set at the low level before the falling edge of signal $\overline{RAS}$ is reached, operation is in the serial input/output mode. At this time, the serial output or input operation occurs in response to the high or low level of the write enable signal $\overline{WE}$ during the time of the falling edge of the signal $\overline{RAS}$. For this serial output, the data transfer (i.e., the read data transfer) from the memory array M-ARY to the latch circuit DFF is conducted. For the serial input, the data transfer (i.e., the write data transfer) from the latch circuit DFF to the memory array M-ARY is conducted. Prior or subsequent to the data transfer operation, continuous data input or output is conducted by the shift register.

Figure 3:
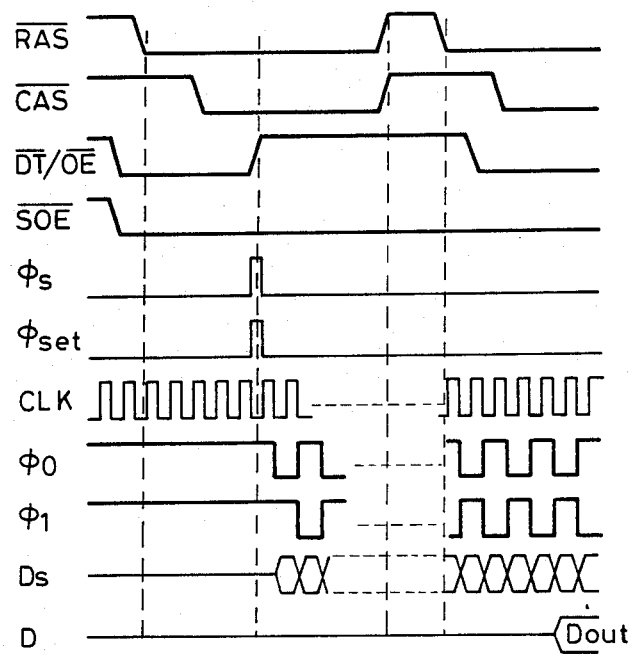
FIGS. 3 and 4 are timing charts showing one example of the operations of the memory of FIG. 1.

FIG. 3 shows an example of the serial output action and the random output action for the serial output period.

If the data transfer and output enable signal $\overline{DT/OE}$ is set at the low level before the row address strobe signal $\overline{RAS}$ varies from the high level to the low level, the timing control signal TC detects the high level of the write enable signal $\overline{WE}$ for determining it as the serial output operation. Incidentally, the write enable signal $\overline{WE}$ is not shown in FIG. 3 because it holds the high level between the serial and random outputs.

The serial output operation is composed of the read data transfer mode and the serial output mode to be executed subsequent to the former. It can be said, in the case where the signal $\overline{DT/OE}$ is at the low level and the signal $\overline{WE}$ is at the high level at the time of the falling edge of the signal $\overline{RAS}$, the control circuit TC can determine the operating mode as being the read data transfer mode. The serial output mode is started as a result of the signal $\overline{DT/OE}$ being raised to the high level in the read data transfer mode. As a result that the control circuit TC is able to distinguish between those modes, the random input/output mode of operation being made ineffective (or inhibited) when in the read data transfer mode but can be made effective during the serial output mode.

When the aforementioned row address strobe signal $\overline{RAS}$ varies from the high level to the low level, the row address buffer R-ADB latches the address signals AX0 to AXn in synchronism with the variation. The row decoders R-DCR0 and R-DCR1 decode the latched address signals, respectively, to generate the selection signals of the corresponding word lines (and dummy word lines). As a result, the selection action of the word lines is conducted. The sense amplifier is later activated to amplify the stored information of the memory cell selected. Thus, a signal according to the stored information of the memory cell selected appears on the respective complementary data lines of the memory arrays M-ARY0 and M-ARY1.

Next, when the column address strobe signal $\overline{CAS}$ later varies from the high level to the low level, the column address buffer C-ADB latches the address signals AY0 to AYn in synchronism with that variation. The column decoder C-DCR decodes the aforementioned latched address signal to generate the data line selection signal corresponding thereto.

After a suitable delay from the falling edge of the signal $\overline{CAS}$, the signal DT/OE rises to the high level.

As a result, the timing signals ∅s and ∅set are generated by the control circuit TC. More specifically, the timing signals ∅s and ∅set are generated in the serial output operation on the basis of the change to a low level of the signal $\overline{DT/OE}$ by the control circuit TC recognizing the serial output action.

In response to the high level of the parallel transfer timing signal ∅s, the parallel transfer switch circuits S-SW0 and S-SW1 are turned on. As a result, the signals of the respective complementary data lines of the aforementioned memory arrays M-ARY0 and M-ARY1 are latched in the respectively corresponding data latch circuits DFF0 and DFF1. Incidentally, the aforementioned timing signal ∅s may be generated by using the change to a low level of the column address strobe signal $\overline{CAS}$. After the end of the read data transfer mode, the signal ∅s is instantly caused to restore the low level. As a result, the individual complementary data lines in the memory arrays M-ARY0 and M-ARY1 are disconnected from the circuit blocks DFF0, DFF1, SW0 and SW1 for the serial input/output. As a result, the random access can be conducted independently of the serial input/output. For this, the parallel transfer switch circuit S-SW is interposed between the column switch circuit C-SW and the latch circuit DFF.

In response to the high level of the preset timing signal ∅set, on the other hand, the switch circuits SW0 and SW1 are turned on. As a result, the output signal of the aforementioned column decoder C-DCR is latched as an initial value in the shift registers SR0 and SR1. More specifically, for example, the selection signal at the logic "0" is latched in the prescribed bits of the shift registers SR0 and SR1 indicated by the decode outputs of the aforementioned address signals AY0 to AYn.

Since the column decoder D-DCR is common between the switch circuits SW and UC-SW, when the initial address of the serial output is given, the signals of the complementary data lines corresponding to the aforementioned prescribed bits are transmitted to the random common data lines Cd and $\overline{CD}$. No signal is outputted to the terminal D because the random input/output circuit I/O is rendered inoperative by the control circuit TC which discriminates as to the data transfer mode, for example. In the read data transfer mode, more specifically, the random input/output are made ineffective. Thus, the column decoder C-DCR can be shared and structurally simplified, but no difficulty is raised by the mode discrimination. After the end of the setting of the initial values of the shift registers SR0 and SR1, the signal ∅set is instantly made to restore the low level. As a result, the column decoder C-DCR is disconnected from the serial input/output shift registers SR0 and SR1. As a result, the random access can be conducted by the column decoder C-DCR.

The respective feeds of the shift clock signals ∅0 and ∅1 to the shift registers SR0 and SR1 are started by the control circuit TC recognizing the high level of the signal $\overline{DT/OE}$ as the serial output mode. As a matter of fact, the feeds of the clock signals ∅0 (and 1) are preferably conducted after the signals ∅s and ∅set have been caused to restore the low level. The aforementioned shift action is conducted by the clock signals ∅0 and ∅1. As a result, the latched information of the latch circuits DFF0 and DFF1 are outputted alternately in series from the external terminal DS in the order from the bit indicated by the column address signals AY0 to AYn in synchronism with the low level of the clock signals ∅0 and ∅1. At this time, the output circuit of the serial input/output circuit SIO is sequentially brought into the active state in response to the low level of the serial output enable signal $\overline{SOE}$ or the low level of the signal $\overline{SOE}$ at the change to a low level of the signal $\overline{RAS}$. By the signals $\overline{RAS}$ and $\overline{CAS}$ being set once at the high level and then at the low level in parallel with the aforementioned serial output action, it is possible to conduct the write-in/read-out by the random access at the unit of 1 bit (or 4 bits).

FIG. 3 shows an example for conducting the random output action in parallel with the serial output action.

The signals $\overline{RAS}$ and $\overline{CAS}$ are set, after they have been reset at the high level, at the low level by a predetermined timing in the recited order.

The random output is conducted by the low level of the output enable signal $\overline{OE}$ ($\overline{DT/OE}$) at the shown timing and the (not shown) high level of the signal $\overline{WE}$. On the basis of the row and column address signals AX0 to AXn and AY0 to AYn latched in synchronism with the change to a low level respective of the signals $\overline{RAS}$ and $\overline{CAS}$, the row address decoder R-DCR0 or R-DCR1 selects one word line, and the column decoder C-DCR connects the paired complementary data lines with the random input/output common data lines. As a result, the content of one memory cell is outputted as data Dout to the terminal D through the random/output circuit I/O. This action is identical to that of the ordinary read-out mode of the known dynamic RAM.

After the high level of the signal ∅s has been dropped to the low level, i.e., after the end of the read data transfer, the random access can be made for the memory array M-ARY. After the high level of the signal ∅set has been dropped at the low level, i.e., after the end of the initial address setting of the serial output, the column decoder C-DCR can be used for the random access. In the present embodiment, it is indicated by the resets of the signals $\overline{RAS}$ and $\overline{CAS}$ that the random access can be conducted. The resets of the signals $\overline{RAS}$ and $\overline{CAS}$ at the high level are conducted with a delay of a predetermined time period after the high level of the signal $\overline{DT/OE}$. Incidentally, during the random output, the output circuit of the serial input/output circuit is made active to produce an output in response to the low level of the signal $\overline{SOE}$. At the instant of the random output, moreover, the output circuit of the random input/output circuit I/O is made active by the control circuit TC recognizing the random output.

After the output of the 1-bit data Dout, the signals $\overline{RAS}$, $\overline{CAS}$ and $\overline{DT/OE}$ are made to restore the high level. As a result, the signal at the terminal D is made ineffective.

For a time period of the serial output mode, a plurality of bit data can be outputted at random by repeating actions similar to the aforementioned ones.

The control circuit TC counts the number of the clock signals ∅0 and ∅1 and interrupts the output of the clock signals ∅0 and ∅1 after a number of clock signals corresponding to that of the complementary data lines have been outputted. As a result, the serial output action including the read data transfer mode and the serial output mode is ended. The end of this operation can be realizable outside of the semiconductor memory by counting the number of the clock signal CLK from the rising timing of the signal $\overline{DT/OE}$ indicating the serial output mode, for example.

Figure 4:
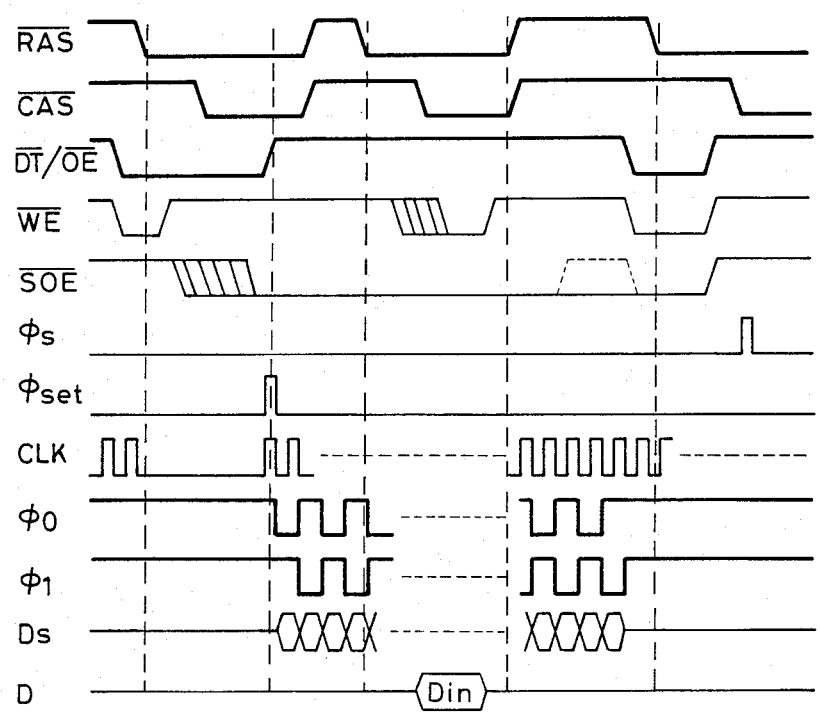

FIG. 4 shows examples of the serial input action and the random input action for the period of the serial input action.

This serial input action is composed of a serial write (or pseudo-write) mode, a serial input mode to be executed subsequent to the pseudo-write mode, and a write data transfer mode. The pseudo-write mode and the write data transfer mode are indicated from the outside by combining the signals $\overline{RAS}$, $\overline{CAS}$, $\overline{DT/OE}$, $\overline{WE}$ and $\overline{SOE}$. The serial input mode is started in the pseudo-write mode as a result that the signal $\overline{DT/OE}$ is raised to the high level. As a result that the control circuit TC discriminates those modes, the random input/output is made ineffective (or inhibited) when in the pseudo-write mode and in the write data transfer mode and is made possible when in the serial input mode.

When the data transfer and output enable signal $\overline{DT/OE}$ is dropped to the low level before the row address strobe signal $\overline{RAS}$ varies from the high level to the low level, the timing control circuit TC detects this to judge it the serial input action by combining it with the low level of the write enable signal WE. In response to the high level of the signal $\overline{SOE}$ at the fall-down of the row address strobe signal $\overline{RAS}$, moreover, the control circuit TC determines the mode as the pseudo-write one.

In this pseudo-write mode, the switching from the serial output to the serial input of the serial input/output circuit SIO is conducted by the control circuit TC. In other words, the serial input/output circuit SIO has its function oriented to the serial input. More specifically, its internal serial input circuit is rendered active whereas its serial output circuit is rendered inactive.

In the pseudo-write mode, moreover, the initial address for the serial input is inputted to the shift register SR. In synchronism with the lowering of the level of the signals $\overline{RAS}$ and $\overline{CAS}$, the row and column address signals AX0 to AXn and AY0 to AYn are latched. Of these, the row address signals AX0 to AXn have no meaning in the action of the memory. This is because the pseudo-write mode is one for designating the column address of the serial input. The column decoder C-DCR decodes the aforementioned latched column address signals AY0 to AYn to generate their corresponding data line selection signals.

After a suitable delay from the falling edge of the signal $\overline{CAS}$, the signal $\overline{DT/OE}$ rises to the high level.

As a result, the timing signal $\emptyset$set is generated by the control circuit TC. More specifically, the timing signal $\emptyset$set is generated on the basis of the rise of the signal $\overline{DT/OE}$ by the control circuit TC recognizing the pseudo-write mode. In response to the high level of the signal $\emptyset$set, the output signal of the column decoder C-DCR is latched as an initial value (i.e., a start address) in the shift registers SR0 and SR1. For example, the aforementioned selection signal at the logic "0" is latched in prescribed bits of the shift registers SR0 and SR1 indicated by the decode outputs of the aforementioned address signals AY0 to AYn. At this time, like the aforementioned serial input action, the signals of the complementary data lines corresponding to the prescribed bits are transmitted to the random input/output common data lines CD and $\overline{CD}$ but raised no problem.

After the serial input mode and the start address of the serial input have been designated, the signals $\overline{RAS}$ and $\overline{CAS}$ are once reset at the high level. Like the aforementioned actions, it is indicated by the resets of the signals $\overline{RAS}$ and $\overline{CAS}$ that the random access can be made by the repeated low level of the signal $\emptyset$set.

The feeds of the shift clock signals $\emptyset$0 and $\emptyset$1 to the shift registers SR0 and SR1 are respectively started by the control signal TC having recognized the high level of the signal $\overline{DT/OE}$ in the pseudo-write mode as the serial input mode. The feeds of the clock signals $\emptyset$0 (and $\emptyset$1) are preferably conducted in fact after the signal $\emptyset$set is dropped again to the low level.

Incidentally, the feed of the clock signal CLK is preferably interrupted for the period of the pseudo-write mode (e.g., from the changing to the low level of the signal $\overline{RAS}$ to the rise of the signal $\overline{DT/OE}$). This makes it possible to easily discriminate that the clock signal CLK which is fed again in synchronism with the rise of the signal $\overline{DT/OE}$ is for the serial input. In the case where the succeeding clock signals CLK are fed, more specifically, it is difficult to determine what clock signal the feeds of the clock signals $\emptyset$0 and $\emptyset$1 are to be started in synchronism with.

The aforementioned shift action is conducted in response to the clock signals $\emptyset$0 and $\emptyset$1. As a result, the informations are inputted alternately in series from the external terminal DS to the latch circuits DFF0 and DFF1 in the order from the bits which is indicated by the aforementioned column address signal in synchronism with the low level of the clock signals $\emptyset$ (i.e., $\emptyset$0 and $\emptyset$1). The external terminal DS is fed in series with the data to be inputted, in synchronism with the clock signals $\emptyset$. Incidentally, at this time, the serial input/output circuit SIO is successively rendered active by the signal $\overline{SOE}$ set at the low level at a suitable timing.

By setting the signals $\overline{RAS}$ and $\overline{CAS}$ once at the high level and again at the low level in parallel with the aforementioned serial input action, it is possible to conduct the write-in/read-out by the random access at the unit of 1 bit (or 4 bits).

FIG. 4 shows an example in which the random input action is conducted in parallel with the serial input action.

The signals $\overline{RAS}$ and $\overline{CAS}$ are reset at the high level and then at the low level at a predetermined timing, and the random input is conducted by the high level of the output signal $\overline{OE}$ (or $\overline{DT/OE}$) and the low level of the signal $\overline{WE}$ at the shown timing, for example. Like the random output, one word line is selected and one pair of the complementary data lines is connected with the random input/output common data lines by the row and column address signals AX0 to AXn and AY0 to AYn which have been latched in synchronism with the change into a low level of the signals $\overline{RAS}$ and $\overline{CAS}$. As a result, the data Din fed to the external terminal D is written in the selected memory cell through the random input/output circuit I/O. This action is identical to that of the ordinary write-in mode of the known dynamic RAM. After the low level of the signal $\emptyset$set, i.e., after the initial address setting of the serial input, the column address decoder C-DCR can be used for the random access. In the present embodiment, it is indicated by the resets of the signals $\overline{RAS}$ and $\overline{CAS}$ that the random access can be conducted. The resets of the signals $\overline{RAS}$ and $\overline{CAS}$ at the high level are conducted with a delay of a predetermined time after the high level of the signal $\overline{DT/OE}$.

After the input of the 1-bit data Din, the signals $\overline{RAS}$, $\overline{CAS}$ and $\overline{WE}$ are set again at the high level. As a result, the signal at the terminal D is made ineffective.

For the time period of the serial input mode, a plurality of bit data can be inputted at random by the action similar to the aforementioned one.

The control circuit TC counts the number of the clock signals $\emptyset$0 and $\emptyset$1 and interrupts the outputs of the clock signals $\emptyset$0 and $\emptyset$1 after these signals have been outputted in a number equal to that of the complementary data lines. As a result, the serial input mode conducted subsequent to the pseudo-write mode is ended. The end of this action can be known at the outside of the semiconductor memory by counting the number of the clock signals CLK from the time of the rise of the signal $\overline{DT/OE}$ which is indicative of the serial output mode for example.

After the end of the serial input mode, i.e., after the information has have been written in a predetermined latch circuit UDFF (of several bits) in the latch circuit DFF0 and DFF1, the write data transfer is conducted at a timing delayed a predetermined time period. Incidentally, at the end of the aforementioned action, the signal $\overline{SOE}$ may be once set at the high level, as indicated by broken lines in FIG. 4.

When the data transfer and output enable signal $\overline{DT/OE}$ is set at the low level before the row address strobe signal $\overline{RAS}$ varies from the high level to the low level, the timing control circuit TC detects and determines it as the serial action. The control circuit TC further determines the write data transfer mode from the low level of the signals $\overline{WE}$ and $\overline{SOE}$ at the changing to a low level of the row address strobe signal $\overline{RAS}$. In synchronism with the change to a low level of the signals $\overline{RAS}$ and $\overline{CAS}$, the row and column address signals AX0 to AXn and AY0 to AYn are latched. Of these, the column address signals AY0 to AYn are made to have no meaning in the memory action. The row decoders R-DCR0 and R-DCR1 decode the latched address signals AX0 to AXn, respectively, to generate the word line (and dummy word line) selections signals corresponding thereto. As a result, the word line selection action is conducted. Although not specifically limited thereto, before the sense amplifier is activated, i.e., at the time when the potential of the complementary data lines fluctuates within a fine potential range from the precharge potential (e.g., ½ Vcc), the parallel transfer timing signal $\emptyset$s is generated. This signal $\emptyset$s is generated at a timing suitably delayed from the signal $\overline{RAS}$, for example. As a result, the potentials at the memory arrays M-ARY0 and M-ARY1 are forcibly made into the potentials corresponding to the data latched in the corresponding data latch circuits DFF0 and DFF1. Incidentally, the aforementioned timing signal $\emptyset$s may be generated by making use of the change to a low level of the column address strobe signal $\overline{CAS}$. This signal $\emptyset$s may also rise simultaneously with the word line selection signal. After this, the sense amplifier is activated to amplify the potentials of the complementary data lines, which are then written as the information in the memory cells.

After the signal $\emptyset$s is dropped again to the low level, the signals $\overline{RAS}$ and $\overline{CAS}$ are raised again to the high level. As a result, the serial input/output or random input/output is conducted again by designating the action mode.

The following operational effects can be obtained from the embodiment thus far described:

(1) By providing both a signal path for transmitting signals in parallel to the data lines of a memory array and a latch circuit and a switch path for connecting said latch circuit and a serial input/output common data line in response to a selection signal generated by a shift register, and by feeding the output signal of a random input/output column decoder as an initial value to the individual bits of said shift register, a column decoder can be used commonly for the random input and output and the serial input/output. As a result, the serial/output and the random input/output can be conducted, and the circuitry therefor can also be simplified.

(2) As a result of the aforementioned effect (1), a serial signal from an arbitrary address can be inputted and outputted.

(3) By adopting the aforementioned latch circuit and shift register of the static type, the serial output action can be realized in a long cycle.

(4) As a result of the aforementioned effect (3), the period of the clock signal fed from the external terminal can be set at an arbitrary value to facilitate the design of a system handling the serial digital signals.

(5) The aforementioned serial output action can be realized with a low power consumption by using the CMOS circuit as the aforementioned static type.

(6) As a result of the aforementioned effects (1) and (3), the random input/output and the serial input/output can be performed simultaneously.

Although the invention has been specifically described hereinbefore in connection with the embodiments disclosed, it should not be limited thereto but that it can in fact be exemplified in the form of other embodiments and/or modifications thereof, including variations of the embodiments presently exemplified within the spirit and scope of the invention.

It goes without saying that the random output action can be conducted in parallel with the serial input action and that the random input action can be conducted in parallel with the serial output action.

The random input or output action can be conducted independently of and not in parallel with the serial input/output action.

It is possible to add a function to conduct the input/output action continuously at a high speed in the known nibble mode, page mode and static column mode in addition to the random input/output at the unit of 1 bit.

The method designates individual modes and the generation or input/output timings of individual signals.

The generating of the shift clock signals $\emptyset 0$ and $\emptyset 1$, i.e., the start of the serial input or output mode, can be implemented without requiring synchronism with the rise of the signal $\overline{DT/OE}$. For example, after the serial input or output mode, the clock CLK is fed at a suitably delayed timing. As a result, the control signal TC generates the clocks $\emptyset 0$ and $\emptyset 1$ on the basis of the clock CLK. In this case, it is preferably indicated by the output signal of the control circuit TC that the serial input or output mode is invited. Moreover, the feed of the clock signal CLK has to be interrupted for a time period other than the serial input or output period.

The setting of the initial value of the shift register SR may be conducted through a pointer circuit. More specifically, the output signal of the column decoder circuit may be once latched in the latch circuit constructing the pointer circuit thereby to conduct the initial value setting of the shift register SR by that latch signal. In this case, the setting of the initial value need not be conducted for each frame when it is intended to obtain data constructing the same display frame.

In FIG. 1, the memory arrays M-ARY0 and M-ARY1 may be constructed to conduct the selection action of the memory cells by the co-called "shared sense amplifier system" in which the memory arrays are arranged at the right and left sides around the sense amplifier. This system is disclosed, for example, in U.S. patent application Ser. No. 729,859 filed on May 2, 1985 cited as a reference in this specification. Moreover, the reference voltage to be used for reading out the stored information of the memory cells may be obtained not only by a system using the dummy cells but also by the so-called "half precharge system or dummy cell-less system" in which the complementary data lines are precharged to one half Vcc/2 of the power source voltage Vcc so that they may be used.

On the other hand, the memory array may be constructed by using not only the dynamic memory cells, as above, but also static memory cells.

The present invention can be widely applied to a semiconductor memory which has the random input-/output function and the serial input/output function.

What is claimed is:

1. A semiconductor memory formed on one chip comprising:
   a memory array including a plurality of word lines, a plurality of data lines intersecting said word lines, and a between said word lines and said data lines;
   a first common data line for inputting and outputting input and output data of said memory cells at random;
   a plurality of first switch means interposed between each of said data lines and said first common data line, wherein each of said plurality of first switch means selectively connects a predetermined data line and said first common data line;
   a plurality of data latching means for latching said output data read out from predetermined memory cells and said input data to be written into predetermined memory cells;
   second switch means for connecting said data lines and said plurality of data latching means;
   a second common data line for inputting and outputting said input and output data of said memory cells in series;
   a plurality of third switch means interposed between said second common data line and said plurality of data latching means, wherein each of said plurality of third switch means selectively connects a predetermined data latching means and said second common data line;
   serial input/output selection means for sequentially selecting said plurality of third switch means;
   first address selecting means for selecting one of said plurality of first switch means in response to an external address signal and for designating one of said plurality of third switch means to be selected at first by said serial input/output selection means; and
   second address selecting means for selecting one of said word lines in response to an external address signal; wherein said plurality of first switch means, said plurality of data latching means, said second switch means, said plurality of third switch means, and said serial input/output selection means are arranged on said chip between said memory array and said first address selecting means.

2. A semiconductor memory according to claim 1, wherein said serial input/output selection means comprises a shift register.

3. A semiconductor memory according to claim 1, wherein the random inputting and outputting of said input and output data of said memory cells are inhibited at least while said second switch means connects said data lines and said plurality of data latching means.

4. A semiconductor memory according to claim 1, wherein on said one chip, said second switch means is arranged between said plurality of first switch means and said plurality of data latching means.

5. A semiconductor memory according to claim 4, wherein said plurality of third switch means and said serial input/output selection means are arranged on said chip between said plurality of data latching means and said first address selecting means.

6. A semiconductor memory according to claim 1, wherein said first address selection means generates a signal for designating one of said third switch means to be selected at first by said serial input/output selection means, said serial input/output selection means comprising a shift register including a latch circuit for latching said signal which is outputted from said first address selecting means.

7. A semiconductor memory according to claim 6, further comprising:
   fourth switch means interposed between said first address selecting means and said serial input/output selection means, for providing said signal generated by said first address selection signal to said serial input/output means,
   wherein the random input and output of said input and output data of said memory cells are inhibited at least while said fourth switch means provides said signal to said serial input/output means.

8. A semiconductor memory according to claim 7, wherein the selections of said first and third switch means are implemented in parallel.

9. A semiconductor memory formed on one chip comprising:
   a first memory array including a plurality of first word lines, a plurality of first data lines intersecting said first word lines and a plurality of first memory cells respectively disposed at the points of intersection between said first word lines and said first data lines, for storing signals;
   a second memory array including a plurality of second word lines, a plurality of second data lines intersecting said second word lines and a plurality of second memory cells respectively disposed at the points of intersection between said second word lines and said second data lines, for storing signals;
   first latching means including a plurality of first latching circuits for respectively latching signals read out from predetermined memory cells of said first memory cells to said first data lines;
   second latching means including a plurality of second latching circuits for respectively latching signals read out from predetermined memory cells of said second memory cells to said second data lines;
   first output means for serially outputting said signals stored in said plurality of first and second memory cells;
   first selection means for sequentially selecting said first latching circuits;
   second selection means for sequentially selecting said second latching circuits;
   first address selection means for selecting each of said first data lines and second data lines in accordance with external address signals, and for first designating each of said first and second latching circuits to be selected by said first and second selection means;
   second output means for outputting signals stored in selected ones of first and second memory cells at random;
   first switching means for connecting said second output means and a first data line selected by said first address selection means; and
   second switching means for connecting said second output means and a second data line selected by said first address selection means;
   wherein said first address selection means is arranged on said chip chip between said first memory array and said second memory array;

wherein said first latching means, said first selection means, and said first switching means are arranged on said chip between first memory array and said first address selection means, and wherein said second latching means, said second selection means and said second switching means are arranged on said chip between said second memory array and said first address selection means.

10. A semiconductor memory formed on one chip according to claim 9, further comprising:
   first transfer means for transferring signals read out from said predetermined memory cells of said first memory array to said first latching means;
   second transfer means for transferring signals read out from said predetermined memory cells of said second memory array to said second latching means; and
   wherein said first and second transfer means are arranged on said chip between said first memory array and said first address selection means and between said second memory array and said first address selection means, respectively.

11. A semiconductor memory formed on one chip according to claim 10, wherein said first address selection means generates first and second designating signals for respectively designating said first and second latching circuits to be selected by said first and second selection means at first, wherein said first selection means comprises a first shift register including a first storing means for storing said first designating signal, and said second selection means comprises a second shift register including a second storing means for storing said second designating signal.

12. A semiconductor memory formed on one chip according to claim 11, further comprising:
   first setting means for applying said first designating signal to said first storing means and a second setting means for applying said second designating signal to said second storing means;
   wherein said first and second setting means are arranged on said chip between said first address selection means and first selection means and between said first address selection means and second selection means, respectively.

13. A semiconductor memory formed on one chip according to claim 12, further including:
   first connecting means for connecting said first output means and a first latching circuit selected by said first selection means;
   second connecting means for connecting said first output means and a second latching circuit selected by said second selection means; and
   wherein said first and second connecting means are arranged on said chip between said first selection means and said first latching means and between said second selection means and said second latching means, respectively.

14. A semiconductor memory formed on one chip according to claim 12, wherein an outputting operation of said first output means and an outputting operation of said second output means are provided in parallel.

15. A semiconductor memory formed on one chip according to claim 14, wherein said outputting operation of said second output means is inhibited at least while said first transfer means transfers signals read out from said predetermined memory cells of said first memory cells to said first latching means.

16. A semiconductor memory formed on one chip according to calim 14, wherein said outputting operation of said second output means is inhibited at least while said second transfer means transfers signals read out from said predetermined memory cells of said second memory cells to said second latching means.

17. A semiconductor memory formed on one chip according to claim 16, wherein said outputting operation of said second output means is inhibited at least while said first setting means is applying said first designating signal to said first storing means.

18. A semiconductor memory formed on one chip according to claim 17, wherein a sequential selecting operation of said first selection means and a sequential selecting operation of said second selection means are mutually implemented in accordance with a control signal.

19. A semiconductor memory formed on one chip according to claim 18, further comprising a second address selection means for selecting one of said plurality of first word lines in accordance with said external address signals, and a third address selection means for selecting one of said plurality of second word lines in accordance with said external address signals.

20. A semiconductor memory formed on one chip comprising:
   a first memory array including a plurality of first word lines, a plurality of first data lines intersecting said first word lines and a plurality of first memory cells, respectively disposed at the points of intersection between said first word lines and said first data lines, for storing signals;
   a second memory array including a plurality of second word lines, a plurality of second data lines intersecting said second word lines and a plurality of second memory cells, respectively disposed at the points of intersection between said second word lines and said second data lines, for storing signals;
   first input means for serially inputting signals to said first and second memory cells;
   first latching means including a plurality of first latching circuits for respectively latching signals to be inputted to predetermined memory cells of said first memory array;
   second latching means including a plurality of second latching circuits for respectively latching signals to be inputted to predetermined memory cells of said second memory array;
   first selection means for sequentially selecting said first latching circuits;
   second selection means for sequentially selecting said second latching circuits;
   first address selection means for selecting each of said plurality of first data lines and each of said plurality of second data lines in accordance with external address signals, and for first designating each of said plurality of first and second latching circuits to be selected by said first and second selection means;
   second input means for inputting said signals to said first and second memory cells at random;
   first switching means for connecting said second input means and a first data line selected by said first address selection means;
   second switching means for connecting said second input means and a second data line selected by said first address selection means;

wherein said first address selection means is arranged between said first memory array and second memory array on said chip;

wherein said first latching means, said first selection means, and said first switching means are arranged between said first memory array and said first address selection means on said chip; and wherein said second latching means, said second selection means, and said second switching means are arranged between said second memory array and said first address selection means on said chip.

21. A semiconductor memory formed on one chip according to claim 20, further comprising:

first transfer means for transferring said signals latched by said first latching means to said predetermined memory cells of said first memory array; and second transfer means for transferring said signals latched by said second latching means to said predetermined memory cells of said second memory array; and wherein said first and second transfer means are arranged on said chip between said first memory array and said first address selection means and between said second memory array and said first address selection means, respectively.

22. A semiconductor memory formed on one chip according to claim 21, wherein said first address selection means first generates first and second designating signals for respectively designating said first and second latching circuits to be selected by said first and second selection means, said first selection means comprises a first shift register including a first storing means for storing said first designating signal, and said second selection means comprises a second shift register including a second storing means for storing said second designating signal.

23. A semiconductor memory formed on one chip according to claim 22, further comprising:

first setting means for applying said first designating signal to said first storing means; and second setting means for applying said second designating signal to said second storing means;

wherein said first and second setting means are arranged on said chip between said first address selection means and said first selection means and between said first address selection means and said second selection means, respectively.

24. A semiconductor memory formed on one chip according to claim 23, further including:

first connecting means for connecting said first input means and one of said first latching circuits selected by said first selection means;

second connecting means for connecting said first input means and one of said second latching circuits selected by said second selection means;

wherein said first and second connecting means are arranged on said chip between said first selection means and said first latching means and between said second selection means and said second latching means, respectively.

25. A semiconductor memory formed on one chip according to claim 24, wherein an inputting operation of said first input means and an inputting operation of said second input means are provided in parallel.

26. A semiconductor memory formed on one chip according to claim 25, wherein said inputting operation of said second input means is inhibited at least while said first transfer means transfers said signals latched by said first latching means to said predetermined memory cells of said first memory array.

27. A semiconductor memory formed on one chip according to claim 26, wherein said inputting operation of said second input means is inhibited at least while said first setting means is applying said first designating signal to said first storing means.

28. A semiconductor memory formed on one chip according to claim 27, wherein a sequential selecting operation of said first selection means and a sequential selecting operation of said second selection means are mutually implemented in accordance with a control signal.

29. A semiconductor memory formed on one chip according to claim 28, further comprising a second address selection means for selecting one of said plurality of first word lines in accordance with said external address signals, and a third address selection means for selecting one of said plurality of second word lines in accordance with said external address signals.

* * * * *